(12) United States Patent
Kusunoki et al.

(10) Patent No.: US 8,809,480 B2
(45) Date of Patent: Aug. 19, 2014

(54) SILICONE RESIN COMPOSITION, LUMINOUS SUBSTANCE-CONTAINING WAVELENGTH-CONVERTING FILM, AND CURED PRODUCT THEREOF

(71) Applicant: Shin-Etsu Chemical Co., Ltd., Tokyo (JP)

(72) Inventors: Takayuki Kusunoki, Annaka (JP); Toshio Shiobara, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 24 days.

(21) Appl. No.: 13/734,515

(22) Filed: Jan. 4, 2013

(65) Prior Publication Data
US 2013/0181167 A1  Jul. 18, 2013

(30) Foreign Application Priority Data
Jan. 16, 2012  (JP) ................................ 2012-005935

(51) Int. Cl.
| | | |
|---|---|---|
| C08G 77/20 | (2006.01) | |
| C08L 83/04 | (2006.01) | |
| C08G 77/04 | (2006.01) | |
| C08G 77/12 | (2006.01) | |

(52) U.S. Cl.
CPC ............. C08G 77/04 (2013.01); *C08G 77/12* (2013.01); *C08G 77/20* (2013.01); C08L 83/04 (2013.01)
USPC .............................. 528/32; 528/31; 524/858

(58) Field of Classification Search
CPC ......... C08L 83/04; C08L 83/00; C08G 77/12; C08G 77/20; H01L 33/502
USPC ........................................ 528/31, 32; 524/858
See application file for complete search history.

(56) References Cited

U.S. PATENT DOCUMENTS

| | | | |
|---|---|---|---|
| 2004/0094757 A1 | 5/2004 | Braune et al. | |
| 2006/0100410 A1* | 5/2006 | Ootake et al. ................... | 528/33 |

FOREIGN PATENT DOCUMENTS

| | | |
|---|---|---|
| JP | A 4-5658 | 1/1992 |
| JP | A 2001-89662 | 4/2001 |
| JP | A 2005-524737 | 8/2005 |
| JP | A 2010-47646 | 3/2010 |
| JP | B2 4636242 | 2/2011 |
| JP | B1 4671309 | 4/2011 |
| JP | A 2011-184625 | 9/2011 |
| WO | WO 2013/094625 A1 | 6/2013 |

OTHER PUBLICATIONS

Mar. 11, 2014 Office Action issued in Japanese Patent Application No. 2012-005935 (with partial translation).

* cited by examiner

*Primary Examiner* — Kuo-Liang Peng
(74) *Attorney, Agent, or Firm* — Oliff PLC (57) ABSTRACT

There is disclosed a silicone resin composition includes (A-1) a ladder structure-containing polyorganosiloxane having a ladder structure and having two or more alkenyl groups in one molecule, (B-1) a ladder structure-containing hydrogen polyorganosiloxane having a ladder structure and having hydrogen atoms that are bonded to two or more silicon atoms in one molecule, and/or (B-2) a hydrogen polyorganosiloxane having two or more hydrogen atoms that are bonded to silicon atoms in one molecule. As a result, there is provided the silicone resin composition as a light-emitting device protective material having a high transparency, heat resistance, light resistance and gas barrier.

13 Claims, 1 Drawing Sheet

SILICONE RESIN COMPOSITION, LUMINOUS SUBSTANCE-CONTAINING WAVELENGTH-CONVERTING FILM, AND CURED PRODUCT THEREOF

BACKGROUND OF THE INVENTION

1. Field of the Invention

The present invention relates to a silicone resin composition, a luminous substance-containing wavelength-converting film, and a cured product thereof.

2. Description of the Related Art

In recent years, photonic devices of a blue light and a white light whose LED light-emitting wavelength is shorter have been developed and widely used. The resulting increase in the luminance of a light-emitting device, having such a shorter light-emitting wavelength, brings about a strong demand for a higher calorific value of the light-emitting device.

Silicone resins having a high transparency, heat resistance and light resistance have been focused on and widely used as a material for sealing and protecting such a high-luminance light-emitting device (Patent Document 1). Unfortunately, degradation of silicone resins remains technically problematic due to exposure of a high energy light and a high heat emitted from a light-emitting device.

In addition, commonly-used silicone resins are not provided with a sufficient gas barrier to sulfur-containing gases, resulting in such problems as the corrosion of conductive wires in LED light-emitting devices and silver materials used in optical reflective materials (Patent Documents 2 to 3). "Sulfur-containing gases" in the present invention mean gas compounds at normal temperature containing sulfur atoms in one molecule such as $SO_x$ and $H_2S$. "Normal temperature" in the present invention is defined as an ambient temperature under a normal state, usually in the range of 15 to 30° C., preferably 25° C.

To solve the aforementioned problem, Japanese Patent No. 4671309 proposes a resin composition obtained by adding a reactant of a (meta)acryloyl group-containing silane coupling agent and an epoxy group-containing silane coupling agent to an addition-type silicone resin composition (Patent Document 4). Unfortunately, its insufficient moisture penetration resistance causes a defect in adhesiveness with a resin substrate such as polyphthalamide with time.

CITATION LIST

Patent Literature

Patent Document 1: Japanese Patent Publication Laid-Open 2005-524737
Patent Document 2: Japanese Patent No. 4636242
Patent Document 3: Japanese Patent Publication Laid-Open No. 2010-047646
Patent Document 4: Japanese Patent No. 4671309

SUMMARY OF THE INVENTION

Accordingly, to solve the aforementioned problem, the development of light-emitting device protective materials having a high transparency, heat resistance, light resistance and gas barrier is being strongly demanded.

It is an object of the present invention to provide a silicone resin composition as a light-emitting device protective material having a high transparency, heat resistance, light resistance and gas barrier, and a luminous substance-containing wavelength-converting film comprising the silicone resin composition.

To solve the aforementioned problems, the present invention provides a silicone resin composition, comprising:

(A-1) a ladder structure-containing polyorganosiloxane having a ladder structure represented by the following general formula (1) and having two or more alkenyl groups in one molecule;

(B-1) a ladder structure-containing hydrogen polyorganosiloxane having a ladder structure represented by the following general formula (2) and having hydrogen atoms that are bonded to two or more silicon atoms in one molecule; and/or (B-2) a hydrogen polyorganosiloxane represented by the following average composition formula (3) having two or more hydrogen atoms that are bonded to silicon atoms in one molecule.

(1)

wherein, $R^1$ represents a substituent selected from the group consisting of an alkyl group having 1 to 10 carbon atoms, an alkenyl group and an aryl group, and $R^1$ may be the same or different. "n" is an integer of one or more.

(2)

wherein, $R^2$ represents a substituent selected from the group consisting of hydrogen atoms, an alkyl group having 1 to 10 carbon atoms and an aryl group, and $R^2$ may be the same or different. n' is an integer of one or more.

$$(R^2{}_3SiO_{1/2})_p(R^2{}_2SiO_{2/2})_q(R^2SiO_{3/2})_r(SiO_{4/2})_s \quad (3)$$

wherein, $R^2$ has the same meaning as before, and $0 \leq p \leq 0.6$, $0 \leq q \leq 1.0$, $0 \leq r \leq 1.0$, $0 \leq s \leq 0.99$ and $p+q+r+s=1.0$.

In this manner, a silicone resin composition containing a polyorganosiloxane having a ladder structure can be a light-emitting device protective material having a high transparency, heat resistance, light resistance and gas barrier.

Furthermore, a silicone resin composition of the present invention can contain (A-2) a polyorganosiloxane represented by the following average composition formula (4) having two or more alkenyl groups in one molecule.

$$(R^1{}_3SiO_{1/2})_w(R^1{}_2SiO_{2/2})_x(R^1SiO_{3/2})_y(SiO_{4/2})_z \quad (4)$$

wherein, $R^1$ has the same meaning as before, and $0 \leq w \leq 0.6$, $0 \leq x \leq 1.0$, $0 \leq y \leq 1.0$, $0 \leq z \leq 0.99$ and $w+x+y+z=1.0$.

Accordingly, the silicone resin composition of the present invention can contain a polyorganosiloxane having two or more alkenyl groups having no ladder structure in one molecule.

In addition, the weight average molecular weight of the (A-1) component and/or the (B-1) component preferably is from $3\times10^3$ to $1\times10^7$.

A polyorganosiloxane having a ladder structure having the above weight average molecular weight can provide a high compatibility with solvents and other additive agents and readily form a coat.

Furthermore, the silicone resin composition preferably comprises:

10 to 100 parts by mass of the (A-1) component;

0 to 90 parts by mass of the (A-2) component, wherein a total of the (A-1) component and the (A-2) component is 100 parts by mass;

0 to 100 parts by mass of the (B-1) component;

0 to 100 parts by mass of the (B-2) component, wherein a total of the (B-1) component and the (B-2) component is 100 parts by mass; and (C) hydrosilylation catalyst.

Accordingly, by containing each polyorganosiloxane determined by each of the above mentioned blending ratios, light-emitting component protective materials having a higher transparency, heat resistance, light resistance and gas barrier can be provided.

Moreover, the silicone resin composition of the present invention preferably contains one or more types of luminous substances.

With a luminous substance contained, the silicone resin composition provides a cure product which is capable of absorbing a light from a semiconductor light-emitting diode, etc., and converting it into a light with a different wavelength.

The present invention provides a luminous substance-containing wavelength-converting film comprising the silicone resin composition, containing 10 to 2,000 parts by mass of a luminous substance relative to 100 parts by mass of components other than the luminous substance of the silicone resin composition.

The luminous substance-containing wavelength-converting film can be a light-emitting device protective material having a high transparency, heat resistance, light resistance and gas barrier, which is capable of absorbing a light from a semiconductor light-emitting diode, etc., and converting it into a light with a different wavelength.

Furthermore, the luminous substance-containing wavelength-converting film is preferably plastic solid or semi-solid at normal temperature in an uncured state.

The luminous substance-containing wavelength-converting film guarantees an excellent handling property.

The average particle diameter of a luminous substance contained in the luminous substance-containing wavelength-converting film is preferably 0.05 to 60% of a thickness of the luminous substance-containing wavelength-converting film, and the maximum particle diameter of the luminous substance is preferably 0.1 to 90% of a thickness of the luminous substance-containing wavelength-converting film.

The average particle diameter is a particle diameter corresponding to 50% of an integrated value with reference to particle size distribution measured with a laser diffraction type particle size distribution measuring apparatus.

The average particle diameter and/or the maximum particle diameter guarantee a light-emitting device protective material having a higher transparency, heat resistance, light resistance and gas barrier.

The present invention provides a cured product obtained by heat-hardening the silicone resin composition or the luminous substance-containing wavelength-converting film.

The cured product guarantees a light-emitting device protective material having a high transparency, heat resistance, light resistance and gas barrier.

As described above, a silicone resin composition comprising a polyorganosiloxane having a ladder structure of the present invention can be a light-emitting device protective material which exhibits a high transparency, heat resistance, light resistance and gas barrier, particularly, sulfur-containing a high gas barrier. By coating LED tips and surrounding materials with the silicone resin composition of the present invention and a silicone film using the silicone resin composition, degradation of these materials can be prevented.

In particular, a luminous substance-containing wavelength-converting film comprising the silicone resin composition of the present invention comprising a luminous substance is capable of absorbing a light from a semiconductor light-emitting diode, etc., and converting it into a light with a different wavelength.

DETAILED DESCRIPTION OF THE PREFERRED EMBODIMENTS

The silicone resin composition, the luminous substance-containing wavelength-converting film and the cured product of the present invention will be described in detail, but the present invention is not restricted thereto. As aforementioned above, the development of light-emitting device protective materials having a high transparency, heat resistance, light resistance and gas barrier has long been demanded.

Inventors of the present invention carried out an extensive investigation with a purpose to obtain a technological advantage of a silicone resin composition comprising a polyorganosiloxane having a ladder structure: use of a light-emitting device protective material having a high transparency, heat resistance, light resistance and gas barrier to complete the present invention. The present invention will be described in more detail.

[(A) Alkenyl Group-Containing Polyorganosiloxane]

An alkenyl group-containing polyorganosiloxane contained in the silicone resin composition of the present invention (hereinafter referred to as (A) component) comprises an essential component, (A-1) a ladder structure-containing polyorganosiloxane having a ladder structure represented by the following general formula (1) and having two or more alkenyl groups in one molecule, and an optional component, (A-2) a polyorganosiloxane represented by the following average composition formula (4) having two or more alkenyl groups in one molecule. The (A-1) or (A-2) component may be used alone or together with other two or more components.

(1)

wherein, $R^1$ represents a substituent selected from the group consisting of an alkyl group having 1 to 10 carbon atoms, an alkenyl group and an aryl group, and $R^1$ may be the same or different. "n" is an integer of one or more.

(4)

wherein, $R^1$ has the same meaning as before, and $0 \leq w \leq 0.6$, $0 \leq x \leq 1.0$, $0 \leq y \leq 1.0$, $0 \leq z \leq 0.99$ and $w+x+y+z=1.0$.

Here, in the general formula (1) and the average composition formula (4), $R^1$ represents a substituent selected from the group consisting of an alkyl group, an alkenyl group and an aryl group having 1 to 10 carbon atoms, and $R^1$ may be the same or different. Examples of the alkyl group include a methyl group, an ethyl group, a propyl group, a butyl group and a cyclohexyl group, and examples of the alkenyl groups include a vinyl group and an allyl group. Examples of the aryl groups include a phenyl group and a methylphenyl group. In a preferred embodiment of the present invention, $R^1$ preferably represents a phenyl group in view of gas penetration resistance and heat resistance. In the general formula (1), "n" is an integer of one or more, preferably 2 to 5000. In the average composition formula (4), $0 \leq w \leq 0.6$, $0 \leq x \leq 1.0$, $0 \leq y \leq 1.0$, $0 \leq z \leq 0.99$ and $w+x+y+z=1.0$.

The (A-1) and (A-2) components each contain two or more alkenyl groups in one molecule. The (A-1) component is not restricted in structure if it has a ladder structure represented by the general formula (1), e.g. the following average composition formula having a ladder structure.

wherein, $R^1$ has the same meaning as before, at least two of them are alkenyl groups. $0 \leq a \leq 0.6$, $0 \leq b \leq 1.0$, $0 \leq c \leq 1.0$, $0 \leq d \leq 0.99$ and $a+b+c+d=1$.

[(B) Hydrogen Polyorganosiloxane]

A hydrogen polyorganosiloxane contained in the silicone resin composition of the present invention (hereinafter referred to as (B) component) comprises (B-1) a ladder structure-containing hydrogen polyorganosiloxane having a ladder structure represented by the following general formula (2) and having hydrogen atoms that are bonded to two or more silicon atoms in one molecule, and (B-2) a hydrogen polyorganosiloxane represented by the following average composition formula (3) having two or more hydrogen atoms that are bonded to silicon atoms in one molecule. The (B-1) or (B-2) component may be used alone, both, or together with other two or more components.

(2)

wherein, $R^2$ represents a substituent selected from the group consisting of an alkyl group having 1 to 10 carbon atoms and an aryl group hydrogen atoms, and $R^2$ may be the same or different. n' is an integer of one or more.

(3)

wherein, $R^2$ has the same meaning as before, and $0 \leq p \leq 0.6$, $0 \leq q \leq 1.0$, $0 \leq r \leq 1.0$, $0 \leq s \leq 0.99$ and $p+q+r+s=1.0$.

Here, in the general formula (2) and the average composition formula (3), $R^2$ represents a substituent selected from the group consisting of hydrogen atoms, an alkyl group having 1 to 10 carbon atoms and an aryl group having carbon atoms 6 to 10, and $R^2$ may be the same or different. Examples of the alkyl group include a methyl group, an ethyl group, a propyl group, a butyl group and a cyclohexyl group. Examples of the aryl group include a phenyl group and a methylphenyl group. In a preferred embodiment of the present invention, $R^2$ preferably represents a phenyl group in view of gas penetration resistance and heat resistance. In the general formula (2), n' is an integer of one or more, preferably 2 to 5000. In the average composition formula (3), $0 \leq p \leq 0.6$, $0 \leq q \leq 1.0$, $0 \leq r \leq 1.0$, $0 \leq s \leq 0.99$ and $p+q+r+s=1.0$.

The (B-1) and (B-2) components each contain hydrogen atoms that are directly bonded to two or more silicon atoms in one molecule. The (B-1) component is not particularly restricted in structure if it has a ladder structure represented by the general formula (2), e.g. the following average composition formula having a ladder structure.

wherein, $R^2$ has the same meaning as before, at least two of them are hydrogen atoms that are directly bonded to silicon atoms. $0 \leq e \leq 0.6$, $0 \leq f \leq 1.0$, $0 \leq g \leq 1.0$, $0 \leq h \leq 0.99$ and $e+f+g+h=1$.

The hydrogen polyorganosiloxanes in the (B-2) component is not particularly restricted, but it is preferably a hydrogen polyorganosiloxane that is similar to the (A-1) component in refractive index in view of compatibility and transparency. For instance, when a (A-1) component containing many phenyl groups, a hydrogen polyorganosiloxane of the (B-2) component preferably contains 10 mole % or more of phenyl groups. Examples of the hydrogen organosiloxane include such substances as represented by the following formulas (5) and (6). In particular, a hydrogen organosiloxane represented by the following formula (5) is preferable. The refractive index can be measured with an Abbe's refractometer, using visible light (589 nm) at 25° C.

(5)

wherein, "i" is an integer of from 1 to 4.

(6)

wherein, "j" is an integer of from 1 to 4.

If the silicone resin composition contains at least one of a ladder structure-containing polyorganosiloxane of the (A-1) component and a ladder structure-containing hydrogen polyorganosiloxane of the (B-1) component, or if the composition is a luminous substance-containing wavelength-converting film, and it is preferable that in view of heat curability and heat resistance from hydrosilylation, 80% or more of the substituent in the (A-1) component are phenyl groups and another 20% or less are vinyl groups. It is preferable that 80% or more of the substituent in the (B-1) component are phenyl groups and another 20% or less are hydrogen atoms.

The ladder structure-containing polyorganosiloxane of the above (A-1) and/or (B-1) components preferably has a weight average molecular weight from $3 \times 10^3$ to $1 \times 10^7$, more preferably from $1 \times 10^4$ to $1 \times 10^6$ in view of compatibility with solvents and other additive agents and easy coating, etc.

The weight average molecular weight can be measured, using polystyrene as a standard substance with a gel-permeation chromatography (GPC) under the following conditions.
[Measurement Conditions]
　Developing solvent: THF (tetrahydrofuran)
　Flow rate: 0.6 mL/min
　Detector: Refractive Index Detector (RI)
　Column: TSK Guardcolomn SuperH-L
　TSKgel SuperRH4000 (6.0 mm I.D.×15 cm×1)
　TSKgel SuperRH3000 (6.0 mm I.D.×15 cm×1)
　TSKgel SuperRH2000 (6.0 mm I.D.×15 cm×2)
　(Products from Tosoh Corporation)
　Column temperature: 40° C.
　Amount of sample injected: 20 μL (THF solution with a concentration of 0.5 percent by mass)

The ladder structure-containing polyorganosiloxane of the above (A-1) and (B-1) components may be a commercial product or synthesized by a known method.

The blending amount of the hydrogen organosiloxane of the (B) component is determined, so that a total of all hydrosilyl groups (SiH group) in the (B) component relative to a total of all alkenyl groups in the (A) component is preferably 0.1 to 4.0 in molar ratio, more preferably 0.5 to 3.0 and much more preferably 0.8 to 2.0. If the molar ratio is 0.1 or more, cure reaction can be readily produced to obtain a cured silicone product easily. If the molar ratio is 4.0 or less, a large volume of unreacted hydrosilyl groups, which can remain in a cured product, can be removed, and temporal change in properties of the cured product can be prevented.

[(C) Hydrosilylation Catalyst]

The silicone resin composition of the present invention can contain (C) hydrosilylation catalyst. The (C) hydrosilylation catalyst is not particularly restricted if it promotes hydrosilylation reaction in the (A) and (B) components. Examples of the (C) hydrosilylation catalyst include platinum black, platinum chloride, chloroplatinic acid, platinum-olefin complex such as platinum-divinylsiloxane complex, platinum catalyst such as platinum-carbonyl complex, palladium catalyst and rhodium catalyst, more preferably chloroplatinic acid and platinum-olefin complex such as platinum-divinylsiloxane complex.

The content of the (C) component may be an amount of a catalyst. For example, in cases where a platinum catalyst is used, the platinum content relative to a total of the (A) and (B) components of 100 parts by mass is preferably $1.0 \times 10^{-4}$ to 1.0 parts by mass, and more preferably $1.0 \times 10^{-3}$ to $1.0 \times 10^{-1}$ parts by mass in view of reaction rate.

The silicone resin composition of the present invention preferably contains the (A) component comprising 10 to 100 parts by mass of the (A-1) component and 0 to 90 parts by mass of the (A-2) component, wherein a total of the (A-1) component and the (A-2) component is 100 parts by mass, and the (B) component comprising 0 to 100 parts by mass of the (B-1) component and 0 to 100 parts by mass of the (B-2) component, wherein a total of the (B-1) component and the (B-2) component is 100 parts by mass, and (C) component. Accordingly, by containing each polyorganosiloxane determined by each of the above mentioned blending ratios, light-emitting component protective materials having a higher transparency, heat resistance, light resistance and gas barrier can be provided.

As required, each of additive agents, other than the above-mentioned (A) to (C) components, can be blended with the silicone resin composition of the present invention.

[Luminous Substance]

The silicone resin composition of the present invention can contain one or more types of luminous substances. The luminous substance is not particularly restricted, but its blending amount is determined, so that components other than the luminous substance relative to a total of the (A) to (C) components of 100 parts by mass is preferably 0.1 to 2,000 parts by mass and more preferably 0.1 to 100 parts by mass. In cases where the silicone resin composition of the present invention is a later-mentioned luminous substance-containing wavelength-converting film, the content of the luminous substance can be set at 10 to 2,000 parts by mass. In the luminous substance contained in the silicone resin composition, the particle diameter measured by particle size distribution measurement such as a laser beam diffraction method using CILAS laser measuring instrument, etc., is preferably 10 nm or more, more preferably 10 nm to 10 μm and much more preferably 10 nm to 1 μm.

The luminous substance preferably absorbs a light from a semiconductor device, particularly a semiconductor light-emitting diode whose nitride-based semiconductor is a luminous layer, and converts it into a light with a different wavelength. Examples of the luminous substances preferably include at least one or more types selected from the group consisting of nitride-based luminous substances and oxynitride-based luminous substances mainly activated with lanthanoids such as Eu and Cu, alkaline earth metal halogen apatite luminous substances mainly activated with lanthanoids such as Eu and transition metal elements such as Mn, alkali earth metal halogen borate luminous substances, alkaline earth metal aluminate luminous substances, alkaline earth metal silicate salt luminous substances, alkaline earth metal sulfide luminous substances, alkaline earth metal thiogallate luminous substances, alkaline earth metal silicon nitride luminous substances, germanate luminous substances, or rare earth aluminate luminous substances mainly activated with lanthanoids such as Ce, rare earth silicate luminous substances or organic luminous substances and organic complex luminous substances mainly activated with lanthanoids such as Eu, and CA—Al—Si—O—N-based oxy-nitride glass luminous substances. More specifically, the luminous substance can be one of the following luminous substances, but it is not restricted thereto.

Examples of the nitride-based luminous substance mainly activated with lanthanoids such as Eu and Ce include $M_2Si_5N_8$:Eu (M is at least one type selected from the group consisting of Sr, Ca, Ba, Mg and Zn.), and in addition to $M_2Si_5N_8$:Eu; $MSi_7N_{10}$:Eu, $M_{1.8}Si_5O_{0.2}N_8$:Eu and $M_{0.9}Si_7O_{0.1}N_{10}$:Eu (M is at least one type selected from the group consisting of Sr, Ca, Ba, Mg and Zn.) etc.

Examples of the oxynitride-based luminous substance mainly activated with lanthanoids such as Eu and Ce include $MSi_2O_2N_2$:Eu (M is at least one type selected from the group consisting of Sr, Ca, Ba, Mg and Zn.) etc.

Examples of the alkaline earth metal halogen apatite luminous substance mainly activated with lanthanoids such as Eu and transition metal elements such as Mn include $M_5(PO_4)_3$X:R (M is at least one type selected from the group consisting of Sr, Ca, Ba, Mg and Zn. X is at least one type selected from the group consisting of F, Cl, Br and I. R is one or more types from Eu, Mn, Eu and Mn.) etc.

Examples of the alkaline earth metal halogen borate luminous substance include $M_2B_5O_9$X:R (M is at least one type selected from the group consisting of Sr, Ca, Ba, Mg and Zn. X is at least one type selected from the group consisting of F, Cl, Br and I. R is one or more types from Eu, Mn, Eu and Mn.) etc.

Examples of the alkaline earth metal aluminate luminous substance include $SrAl_2O_4$:R, $SR_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R (R is one or more types from Eu, Mn, Eu and Mn.) etc.

Examples of the alkaline earth metal sulfide luminous substance include $La_2O_2S$:Eu, $Y_2O_2S$:Eu and $Gd_2O_2S$:Eu, etc.

Examples of the rare earth aluminate luminous substance mainly activated with lanthanoids such as Ce include YAG-based luminous substances represented by composition formulae of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y, Gd)_3(Al, Ga)_5O_{12}$, and $Tb_3Al_5O_{12}$:Ce and $Lu_3Al_5O_{12}$:Ce in which part or all of Y is substituted by Tb, Lu, etc.

Other luminous substances include ZnS:Eu, $Zn_2GeO_4$:Mn and $Mga_2S_4$:Eu (M is at least one type selected from the group consisting of Sr, Ca, Ba, Mg and Zn. X is at least one type selected from the group consisting of F, Cl, Br and I.) etc.

The above-mentioned luminous substances can contain one or more types selected from the group consisting of Tb, Cu, Ag, Au, Cr, Nd, Dy, Co, Ni and Ti, instead of Eu or in addition thereof, as required.

A CA—Al—Si—O—N-based oxy-nitride glass luminous substance is a parent material made of an oxy-nitride glass containing $CaCo_3$ (20 to 50 mole %), $Al_2O_3$ (0 to 30 mole %), SiO (25 to 60 mole %), AlN (5 to 50 mole %) and rare-earth oxide or transition metal oxide (0.1 to 20 mole %) (represented by mole %, converted into CaO, respectively), so that a total of the 5 components is 100 mole %. Meanwhile, in a luminous substance as a parent material made of an oxy-nitride glass, the nitride content is preferably 15 wt % or less, and other rare earth ions as a sensitizer, in addition to rare-earth oxides ions, is preferably contained in a fluoroglass as a rare-earth oxide, so that they are contained as a coactivator whose content is from 0.1 to 10 mole %.

Also, luminous substances other than the above-mentioned luminous substances can be used if they have similar performances and effects.

[Inorganic Filler]

In addition, an inorganic filler can be added to the silicone resin composition of the present invention. Examples of the inorganic filler include reinforcing inorganic fillers such as fumed silica and fumed titanium dioxide, unreinforcing inorganic fillers such as calcium carbonate, calcium silicate, titanium dioxide, ferric oxide and zinc oxide. Each of the inorganic fillers can be used alone or together with one or more types and not particularly restricted. The inorganic filler can be blended in the range of 0 to 900 parts by mass relative to the total 100 parts by mass of the (A) and (B) components.

[Adhesion Auxiliary]

Also, an adhesion auxiliary can be added to the silicone resin composition of the present invention to provide adhesiveness, as required. Examples of the adhesion auxiliary include a linear or a cyclic organosiloxane oligomer having at least two, or preferably three functionalities selected from the group consisting of hydrogen atoms that are bonded to silicon atoms in one molecule, an alkenyl group, an alkoxy group and an epoxy group. The organosiloxane oligomer preferably contains 4 to 50 silicon atoms, and more preferably 4 to 20 silicon atoms. Examples of the preferred adhesion auxiliary include an organo-oxysilyl-modified isocyanurate compound represented by the following general formula (7) and its hydrolysis condensate (organosiloxane-modified isocyanurate compound).

(7)

wherein, $R^3$ represents an organic group represented by the following formula (8), or a monovalent hydrocarbon group containing an aliphatic unsaturated bond, and at least one of $R^3$ is an organic group represented by the formula (8).

(8)

wherein, $R^4$ represents hydrogen atoms or a monovalent hydrocarbon group having 1 to 6 carbon atoms, and "k" is an integer of from 1 to 6, particularly from 1 to 4.

The blending amount of the adhesion auxiliary relative to a total 100 parts by mass of the (A) component is preferably 10 parts by mass or less, more preferably 0.1 to 8 parts by mass, and much more preferably 0.2 to 5 parts by mass. When the blending amount is 10 parts by mass or less, the hardness of the cured product becomes higher and the surface-tacking property can be reduced.

[Liquid Silicone Component]

As required, a liquid silicone component other than the (A) and (B) components can be added. Examples of the liquid silicone component include vinylsiloxane, hydrogen siloxane, alkoxy siloxane, hydroxy siloxane and a mixture thereof, preferably with a viscosity of 1 to 100,000 mPa·s at 25° C. The liquid silicone component is preferably 50 percent by mass relative to the entire silicone resin composition of the present invention.

[Cure Inhibitor]

A cure inhibitor may be used to control storage stability and reactivity of the silicone resin composition of the present invention. Examples of the cure inhibitor include a compound selected from the group consisting of triallyl isocyanurate, alkyl maleate, acetylene alcohols and its modified silane and modified siloxane, hydroperoxide, tetramethylethylene diamine, benzotriazole and a mixture thereof. The cure inhibitor can be added preferably by 0.001 to 1.0 parts by mass relative to the total 100 parts by mass of the (A-1) and (A-2) components, and more preferably 0.005 to 0.5 parts by mass.

[Other Additive Agents]

Other optional components can be blended with the silicone resin composition of the present invention, in addition to the above (A) to (C) components and a luminous substance, an inorganic filler, an adhesion auxiliary, a liquid silicone and a cure inhibitor. Examples of the other optional components include antioxidants, radical inhibitors, flame retardants, surfactants, antiozonants, light stabilizers, thickening agents, plasticizers, antioxidants, heat stabilizers, conductivity imparting agents, antistatic agents, radiation shielding agents, nucleus agents, phosphorous peroxide decomposition agents, lubricants, colorants, metal deactivators, physical property adjusters and organic solvents. Each of the optional components may be used alone or together with two or more types.

[Preferred Embodiments of the Silicone Resin Composition of the Present Invention]

The silicone resin composition of the present invention is not particularly restricted if it contains (A-1) component, (B-1) and/or (B-2) components. The simplest embodiment represents that the silicone resin composition contains (A), (B) and (C) components or a luminous substance is added to the (A), (B), and (C) components, and the silicone resin composition contain no inorganic fillers such as silica filler. Examples of the inorganic filler include the above substances.

[Preparation of the Silicone Resin Composition and the Cured Product of the Present Invention]

The silicone resin composition of the present invention can be prepared by mixing (A-1), (B-1) and/or (B-2) components according to any optional method. Also, the silicone resin composition of the present invention can be prepared by mixing (A), (B) and (C) components only, the (A), (B) and (C) components and a luminous substance, or the (A), (B), (C) components and any optional component(s) by any optional method. Specifically, by equally mixing the (A), (B), (C) components and the above optional component(s) in a commercial mixer (e.g. "THINKY" CONDITIONING MIXER), the silicone resin composition of the present invention can be prepared.

The silicone resin composition of the present invention may be formed into a film in a solventless condition, and the silicone resin composition may be dissolved in organic solvents to make a varnish. The organic solvents are not particularly restricted, but examples thereof include hydrocarbon-based solvents such as benzene, toluene and xylene; ether-based solvents such as tetrahydrofuran, 1,4-dioxane and diethyl ether; ketone-based solvents such as methyl ethyl ketone; halogen-based solvents such as chloroform, methylene chloride and 1,2-dichloroethane; alcoholic solvents such as methanol, ethanol, isopropyl alcohol and isobutyl alcohol; octamethylcyclotetrasiloxane, hexamethyldisiloxane, and solvents such as cellosolve acetate, cyclohexanone, butyl cellosolve, methylcarbitol, carbitol, buthylcarbitol, diethylcarbitol, cyclohexanol, diglyme and triglyme. Each of the organic solvents may be used alone or together with two or more types.

[Luminous Substance-Containing Wavelength-Converting Film]

Also, when the silicone resin composition containing a luminous substance is used as a film, a luminous substance-containing wavelength-converting film is made, so that the luminous substance contained is preferably 10 to 2,000 parts by mass relative to 100 parts by mass of components other than the luminous substance of the silicone resin composition, more preferably 10 to 1000 parts by mass. The luminous substance-containing wavelength-converting film can be a light-emitting device protective material having a high transparency, heat resistance, light resistance and gas barrier. Also, it is capable of absorbing a light from a semiconductor light-emitting diode and converting it into a light with a different wavelength. In view of handling property, the luminous substance-containing wavelength-converting film is preferably plastic solid or semi-solid in an uncured state at normal temperature.

To provide a light-emitting device protective material having a higher transparency, heat resistance, light resistance and gas barrier, the average particle diameter of a luminous substance contained in a luminous substance-containing wavelength-converting film is preferably 0.05 to 60% of a thickness of the luminous substance-containing wavelength-converting film, and more preferably 10 to 60%. Likewise, the maximum particle diameter of the luminous substance is preferably 0.1 to 90% of a thickness of the luminous substance-containing wavelength-converting film, and more preferably 10 to 90%.

[Cured Product]

In addition, the present invention provides a cured product obtained by heat-hardening the silicone resin composition or the luminous substance-containing wavelength-converting film. The silicone resin composition or luminous substance-containing wavelength-converting film of the present invention can be hardened at 60 to 180° C. for 1 to 12 hours, particularly preferably at 60 to 150° C. by a step cure. The step cure hardening preferably includes the following 2 steps. First, a silicone resin composition or a luminous substance-containing wavelength-converting film is heated at 60 to 120° C. for 0.5 to 2 hours to be preliminarily curing. Then, the preliminarily curing silicone resin composition or luminous substance-containing wavelength-converting film is heat-hardened at 150 to 180° C. for 1 to 10 hours. It is particularly preferable that the silicone resin composition or the luminous substance-containing wavelength-converting film is preliminarily curing at 100° C. for 1 hour and then heat-hardened at 150° C. for 3 to 8 hours. The step cure can sufficiently harden the silicone resin composition or the luminous substance-containing wavelength-converting film having thick coats to provide a clear, colorless cured product without any bubbles.

The glass transition point (Tg) of a cured product obtained by hardening the silicone resin composition of the present invention is so high that a commercial instrument (a thermomechanical tester from ULVAC-RIKO, Inc. (name of product: TM-7000, temperature range: 25 to 200° C.)) cannot detect it. Thus, it is found that the cured product obtained is extremely excellent in heat resistance.

[Use of Silicone Resin Composition, Luminous Substance-Containing Wavelength-Converting Film and Cured Product]

Figure 1:
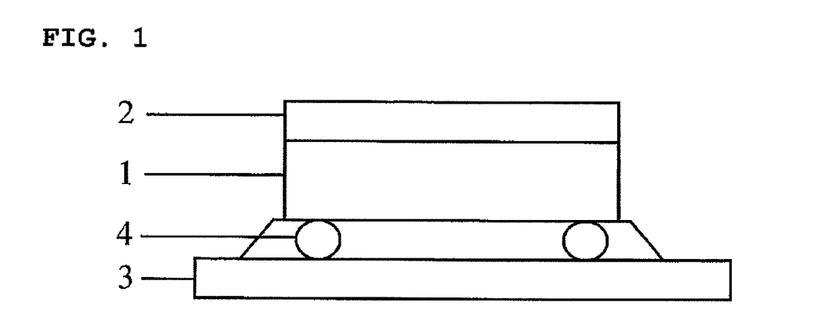
FIG. 1 is an approximately sectional view showing a coat which is directly formed on a light-emitting device, using a silicone resin composition of the present invention.
Figure 2:
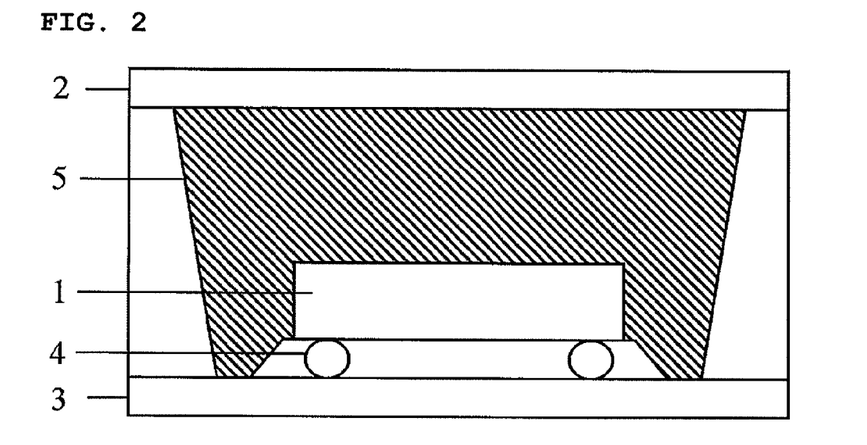
FIG. 2 is an approximately sectional view showing a coat which is formed on a sealing layer for sealing a light-emitting device, using the silicone resin composition of the present invention.

The silicone resin composition and luminous substance-containing wavelength-converting film of the present invention are useful for sealing an LED device, particularly for sealing a blue-light LED device and an ultraviolet LED device. The silicone resin composition of the present invention seals an LED device by a known method, e.g. spin coat method, spray coating method or squeegee method. Specifically, as shown in FIG. 1 or 2, a silicone resin layer 2 is formed directly on a light-emitting device 1 mounted on a ceramic circuit substrate 3 via a gold bump 4, or on a sealant layer 5 that seals the light-emitting device 1. As required, the sealing can be carried out in the form of a varnish by diluting the silicone resin composition with a solvent. The solvent is not particularly restricted if it can dissolve the silicone resin composition, and it can evaporate the silicone resin composition at room temperature or under heating conditions after a coat is formed. A light-emitting device can also be coated by forming the silicone resin composition of the present invention in a film by a film coater and a thermal press machine and pressure-binding it on the light-emitting device. The coat formed according to this method may be used. In cases where a wavelength-converting film containing a luminous substance is used, a light-emitting device can be coated in the same manner. In either method, the silicone resin composition or the luminous substance-containing wavelength-converting film is preferably heat-hardened at 60 to 180° C. for several minutes to hours after a coat is formed, and preferably hardened using the above step cure.

The silicone resin composition, the luminous substance-containing wavelength-converting film and the cured product of the present invention provide excellent heat resistance, light resistance and transparency to be used for such other uses as display materials, optical recording medium materials, optical apparatus materials, optical component materials, optical fiber materials, optical and electronic functional organic materials and semiconductor integrated circuit peripheral materials.

EXAMPLES

In the following, the present invention will be explained specifically by Examples and Comparative Examples, but the present invention is not restricted to the following Examples. The weight average molecular weight shown in the following Examples is measured by gel-permeation chromatography (GPC) under the following conditions, using polystyrene as a standard substance. Ph is a phenyl group, Me is a methyl group, Vi is a vinyl group, and % is percent by mass unless otherwise stated.

[Measurement Conditions]
Developing solvent: THF
Flow rate: 0.6 mL/min
Detector: Refractive Index Detector (RI)
Column: TSK Guardcolomn SuperH-L
TSKgel SuperRH4000 (6.0 mm I.D.×15 cm×1)
TSKgel SuperRH3000 (6.0 mm I.D.×15 cm×1)
TSKgel SuperRH2000 (6.0 mm I.D.×15 cm×2)
(Products from Tosoh Corporation)
Column temperature: 40° C.
Amount of sample injected: 20 μL (THF solution with a sample concentration of 0.5%)

Synthesis Example 1

An organochlorosilane (1200 g, 5.67 mol) represented by $PhSiCl_3$ and an organochlorosilane (229 g, 1.42 mol) represented by $ViSiCl_3$ were dissolved in toluene (1500 g), and added to water (6000 g) dropwise to carry out hydrolysis. Afterward, the product was washed with water and alkaline for neutralization and azeotropic dehydration to prepare a toluene solution (nonvolatile component: 38.1%) of a polyorganosiloxane having a structure represented by $(PhSi(OH)_d O_{(3-d)/2})(ViSi(OH)_d O_{(3-d)/2})$ ("d" is 0 or 1). Next, a potassium hydroxide aqueous solution (KOH concentration: 25%, 4.96 g) was added to the polyorganosiloxane solution (1000 g) for an alkaline equilibrium reaction at 120° C. for 8 hours to synthesize a polyorganosiloxane (I) having a ladder structure with $R^1$ in the formula (1) comprising a phenyl group and a vinyl group. Afterward, the product was cooled until the temperature was 60° C., and an acetic acid (1.3 g) was added thereto for neutralization, and washed with water and subjected to azeotropic dehydration and desolvation. The weight average molecular weight of the vinyl group-containing polyorganosiloxane(I) having the ladder structure was $1.6 \times 10^4$, and infrared absorption spectrum method confirmed that the ladder structure was contained, and $^1$H-NMR analysis found that 81.2 mol % of $R^1$ was phenyl groups and 18.8 mol % of $R^1$ was vinyl groups.

Synthesis Example 2

An organochlorosilane (1350 g, 6.38 mol) represented by $PhSiCl_3$ and an organochlorosilane (114.50 g, 0.71 mol) represented by $ViSiCl_3$ were dissolved in a toluene (1500 g) and added to water (6000 g) dropwise to carry out hydrolysis. Afterward, the product was washed with water and alkaline for neutralization and azeotropic dehydration to prepare a toluene solution (nonvolatile component: 39.4%) of a polyorganosiloxane having a structure represented by $(PhSi(OH)_d O_{(3-d)/2})(ViSi(OH)_d O_{(3-d)/2})$ ("d" is 0 or 1). Next, a solvent (a mixture of biphenyl (30%) and diphenyl ether (70%), 52.49 g) and a methanol solution of potassium hydroxide (KOH concentration: 3.14%, 5 g) were added to the polyorganosiloxane solution (400 g) to remove by distillation and heat each solvent until the temperature was 250° C., and an alkaline equilibrium reaction at 250° C. for 1 hour synthesized a polyorganosiloxane (II) having a ladder structure with $R^1$ in the formula (1) comprising a phenyl group and a vinyl group. Afterward, the product was cooled until the temperature was 60° C., and an acetic acid (0.17 g) was added thereto for neutralization. After the product was dissolved in THF (600 g), it was reprecipitated with a methanol (3 kg) to be purified. The weight average molecular weight of a vinyl group-containing polyorganosiloxane (II) having the ladder structure was $6.2 \times 10^5$, and infrared absorption spectrum method confirmed that a ladder structure was contained and $^1$H-NMR analysis found that 90.2 mol % of $R^1$ was phenyl groups and 9.8 mol % of $R^1$ was vinyl groups.

Comparative Synthesis Example

An organochlorosilane (1587 g, 7.5 mol) represented by $PhSiCl_3$ was dissolved in a toluene (1950 g) and cooled, so that the temperature was kept at 25° C. or under, and water (810 g) was added thereto dropwise to carry out hydrolysis. Afterward, the product was washed with water and alkaline for neutralization and azeotropic dehydration to prepare a toluene solution (nonvolatile component: 34.6%) of a polyorganosiloxane having a structure represented by $(PhSi(OH)_d O_{(3-d/2)})$ ("d" is 0 or 1). Next, a solvent (a mixture of biphenyl (30 percent by mass) and a diphenyl ether (70 percent by mass), 46.18 g) and a methanol solution of a potassium hydroxide (KOH concentration: 2.78 percent by mass, 5 g) were added to the prepared polyorganosiloxane solution (400 g) to remove by distillation and heat each solvent until the temperature was 250° C., and an alkaline equilibrium reaction at 250° C. for 1 hour synthesized a polyorganosiloxane (III) having a ladder structure with $R^1$ in the formula (1) comprising all phenyl groups. Afterward, the product was cooled until the temperature was 60° C., and an acetic acid (0.15 g) was added thereto for neutralization. After the product was dissolved in THF (600 g), it was reprecipitated with a methanol (3 kg) to be purified. The weight average molecular weight of a polyorganosiloxane (III) having the ladder structure was $1.1\times10^5$, and infrared absorption spectrum method confirmed that the ladder structure was contained.

Example 1

After a hydrogen organosiloxane (42 g, H value: 0.377 mmol/g) having the average composition formula represented by the following formula (9) and a divinylsiloxane complex of a chloroplatinic acid (0.35 g, containing 1 wt % platinum) were added to the vinyl group-containing polyorganosiloxane (I) (100 g, vinyl value: 0.154 mmol/g) having the ladder structure of the Synthesis Example 1, the product was equally dissolved in THF (100 g), and the THF was removed by distillation under reduced pressure to prepare a silicone resin composition in which each of the components were well-mixed. The product was used for the following evaluation.

(9)

wherein, "n" is 2.0 on average.

Heat Resistance Test:

The prepared silicone resin composition (100 g) was dissolved in THF 100 g and squeegeed on a 1 mm-thick glass slide taped with 180 μm Teflon tape (trademark) on the edges, and was left at room temperature for 12 hours to evaporate the THF and prepare a film of the silicone resin composition (film thickness: approx. 50 μm). Then, a cured product of the silicone resin film was obtained by heat-hardening the film at 150° C. for 4 hours. The initial transmittance of the cured product of the obtained film at a light wavelength of 365 nm was measured with a visible-ultraviolet spectrophotometer. Afterward, the product was left in an oven at 180° C. for 336 hours, and the transmittance was measured again at a light wavelength of 365 nm. The results are shown in Table 1.

Light Resistance Test:

In the same manner as the above-described heat resistance test, a cured product of a silicone resin film whose film thickness is approx. 50 μm was prepared on a 1 mm-thick glass slide, and a laser beam with a wavelength of 440 nm (power: 250 mW/mm²) was irradiated at 150° C. for 900 hours, using a laser irradiation device having a temperature adjusting function. By defining the initial transmittance (0 hour) at 440 nm as 100%, each transmittance was measured after a laser was irradiated for 900 hours. The results are shown in Table 1.

Sulfur Resistance Test:

In this test, an LED package, having a silver surface on the bottom, which is sealed with a heat-curable dimethyl polysiloxane-based silicone resin (name of product: LPS-3419, product from Shin-Etsu Chemical Co., Ltd.) was used. The LED package was dissolved in anisole, so that the polyorganosiloxane content rate in the prepared silicone resin composition is 5%. As shown in FIG. 2, by spray-coating on a sealant layer 5 of the LED package, a silicone resin layer 2 (film thickness: approx. 20 μm) was formed. The silicone resin layer was dried at room temperature for 1 hour and heat-hardened at 150° C. for 1 hour to prepare a sample for sulfur resistance test. Subsequently, an ammonium sulfide aqueous solution containing an ammonium sulfide solution (sulfur content: 0.5 percent by mass) (50 g) and a purified water (50 g), and the sample for sulfur resistance test were placed in an airtight glass container and left for 72 hours. Here, the sample for sulfur resistance test was placed, so that it was kept away from the ammonium sulfide aqueous solution. The state of sulfuration on the silver surface of the bottom of the LED package was confirmed 24 and 72 hours after the start of leaving and the number of samples out of 5 test samples, whose color changed to black due to sulfuration, is shown in Table 1.

Measurement of Moisture Vapor Transmission Rate:

The prepared silicone resin composition (100 g) was dissolved in THF (100 g) and squeegeed on PTFE having a weir formed with 180 μm teflon (trademark) tapes and left at room temperature for 12 hours to for THF evaporation to prepare a film of the silicone resin composition (film thickness: approx. 50 μm). Afterward, by heat-hardening the film at 150° C. for 4 hours, a cured product of the silicone resin film was prepared and by laminating 10 of the hardened films, a laminated film (film thickness: approx. 500 μm) of the cured product of the silicone resin was obtained. In the laminated film obtained, the moisture vapor transmission rate was measured in compliance with JIS K 7129 by Lyssy method (name of apparatus: L80-5000, product from Lyssy Corporation). The results are shown in Table 1.

Measurement of Chromaticity Coordinate:

A luminous substance (YAG) with a particle diameter of 5 μm (average particle diameter) (10 g) was added to the prepared silicone resin composition (90 g). After THF (90 g) was added thereto, the product was sufficiently agitated with a planetary mixer to obtain a luminous substance-containing silicone resin composition for measuring a chromaticity. The luminous substance-containing silicone resin composition was applied on a 50 μm PTFE film (compressing base film) with a blade of a film coater at 150 μm and dried at 60° C. for 2 minutes to prepare an approx. 50 μm solid film. The solid film was further placed between a 25 μm PTFE film (release films) and the 50 μm PTFE film to be formed into a 50 μm-thick film by nipping with a roll. The composition film obtained was cut into small tip pieces, together with the release film. As shown in FIG. 1, the film pieces obtained were placed on a GaN-based LED tip (light-emitting device 1), so that the composition can keep in contact with the LED tip, and then the release film was removed. The product was heat-hardened at 150° C. for 1 hour. Using a LED tip 1 coated with a luminous substance-containing silicone resin layer 2 obtained accordingly, a light-emitting semiconductor (LED) apparatus of a flip tip structure, as shown in FIG. 1, was prepared on a ceramic circuit substrate 3 via a gold bump 4. By subjecting each of 3 LEDs prepared ("n" is sample number in Table 1.) to illumination, the chromaticity coordinate was measured to be defined as the initial value, using LED optical characteristic monitor (product of Otsuka Electronics Co., Ltd. (LE-3400)). Afterward, in the prepared LED, the chromaticity coordinate was measured under a condition of 80° C./80% Rh in the same manner after it was left for 120 hours. The absolute value of a difference between initial "x" and "y" values in chromaticity coordinates according to CIE XYZ colorimetric system was determined and evaluated as a variation in chromaticity coordinate (Δ). The results are shown in Table 1.

Example 2

After a hydrogen organosiloxane (25.15 g, H value: 0.377 mmol/g) with the average composition formula represented by the above formula (9) and a divinylsiloxane complex of a chloroplatinic acid (0.12 g, containing 1 wt % platinum) were added to a vinyl group-containing polyorganosiloxane (II) (100 g, vinyl value: 0.079 mmol/g) having a ladder structure of the Synthesis Example 2, the product was dissolved in THF (100 g) and the THF was removed by distillation under reduced pressure to prepare a silicone resin composition, in which each of the components was sufficiently mixed. Evaluation was made as in the Example 1.

Example 3

After a hydrogen organosiloxane (15.1 g, H value: 0.523 mmol/g) having a ladder structure with the average composition formula represented by the following formula (10) and having hydrogen atoms that are bonded to two or more silicon atoms in one molecule and a divinylsiloxane complex (0.12 g, containing 1 wt % platinum) of a chloroplatinic acid were added to a vinyl group-containing polyorganosiloxane (II) (100 g, vinyl value: 0.079 mmol/g) having a ladder structure in the Synthesis Example 2, the product was dissolved in THF (100 g) and the THF was removed by distillation under reduced pressure to prepare a silicone resin composition, in which each of the components was sufficiently mixed. Evaluation was made as in the Example 1.

wherein, "t" is 2.0 on average.

Comparative Example 1

Each characteristic was evaluated in the same manner as in the Example 1, except using alone a polyorganosiloxane (III) having a ladder structure obtained in the Comparative Synthesis Example, instead of a polyorganosiloxane (I), a hydrogen organosiloxane (9) and a platinum catalyst in the Example 1. The results are shown in Table 1.

Comparative Example 2

Each characteristic was evaluated in the same manner as in the Example 1, except using alone a commercial heat-curable phenyl group-containing silicone resin composition (name of product: LPF-200, product from Shin-Etsu Chemical Co., Ltd.) containing no ladder structure, instead of a polyorganosiloxane (I), a hydrogen organosiloxane (9) and a platinum catalyst in the Example 1. The results are shown in Table 1.

TABLE 1

|  |  | Exampe 1 | Exampe 2 | Exampe 3 | Comparative Example 1 | Comparative Example 2 |
|---|---|---|---|---|---|---|
| Appearance | | Clear, colorless | Clear, colorless | Clear, colorless | Clear, colorless | Clear, colorless |
| Heat resistance test | Initial transmittance (%) | 99.6 | 99.6 | 99.5 | 99.5 | 99.4 |
| | Transmittance at 180° C. after 336 hrs. (%) | 98.8 | 98.6 | 98.9 | 98.1 | 97.8 |
| Light resistance test [*1] [% T] | | 98.4 | 98.3 | 98.5 | 97 | 96.9 |
| Sulfur resistance test | 24 hrs. | 0/5 | 0/5 | 0/5 | 0/5 | 1/5 |
| | 72 hrs. | 1/5 | 0/5 | 0/5 | 3/5 | 5/5 |
| Measurement of moisture vapor transmission rate[g/mm · day] | | 16 | 15 | 14 | 28 | 40 |

| | n | x | y | x | y | x | y | x | y | x | y |
|---|---|---|---|---|---|---|---|---|---|---|---|
| Chromaticity coordinate measurement (Initial value) | 1 | 0.310 | 0.310 | 0.310 | 0.310 | 0.310 | 0.310 | 0.310 | 0.310 | 0.310 | 0.311 |
| | 2 | 0.310 | 0.310 | 0.310 | 0.310 | 0.310 | 0.310 | 0.310 | 0.310 | 0.311 | 0.310 |
| | 3 | 0.310 | 0.310 | 0.310 | 0.310 | 0.310 | 0.310 | 0.310 | 0.310 | 0.310 | 0.310 |

TABLE 1-continued

|  | n | x | y | x | y | x | y | x | y | x | y |
|---|---|---|---|---|---|---|---|---|---|---|---|
| Chromaticity coordinate variation (Δ) | 1 | 0 | 0 | 0 | 0.01 | 0.01 | 0 | 0.04 | 0.02 | 0.07 | 0.05 |
|  | 2 | 0 | 0 | 0.01 | 0 | 0 | 0 | 0.03 | 0.04 | 0.06 | 0.07 |
|  | 3 | 0 | 0.01 | 0 | 0 | 0 | 0.01 | 0.03 | 0.03 | 0.07 | 0.06 |

※1 The initial transmittance is defined as 100% T.

As obviously indicated in Table 1, using a silicone resin composition containing a polyorganosiloxane having a ladder structure of the present invention, a wavelength-converting film comprising the silicone resin composition and the composition having an excellent heat resistance, light resistance and gas barrier can be prepared, and an excellent property for protecting an LED tip can be obtained.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

EXPLANATION OF REFERENCES

1 . . . light-emitting device,
2 . . . silicone resin layer,
3 . . . ceramic circuit substrate,
4 . . . gold bump, and
5 . . . sealant layer.

What is claimed is:

1. A silicone resin composition, comprising:
(A-1) a ladder structure-containing polyorganosiloxane having a ladder structure represented by the following general formula (1) and having two or more alkenyl groups in one molecule;
(B-1) a ladder structure-containing hydrogen polyorganosiloxane having a ladder structure represented by the following general formula (2) and having hydrogen atoms that are bonded to two or more silicon atoms in one molecule; and/or
(B-2) a hydrogen polyorganosiloxane represented by the following average composition formula (3) having two or more hydrogen atoms that are bonded to silicon atoms in one molecule,

(1)

wherein $R^1$ represents a substituent selected from the group consisting of an alkyl group having 1 to 10 carbon atoms, an alkenyl group and an aryl group, and $R^1$ may be the same or different, "n" represents an integer of one or more, (2)

wherein $R^2$ represents a substituent selected from the group consisting of hydrogen atoms, an alkyl group having 1 to 10 carbon atoms and an aryl group, $R^2$ may be the same or different, n' represents an integer of one or more, $(R^2{}_3SiO_{1/2})_p(R^2{}_2SiO_{2/2})_q(R^2SiO_{3/2})_r(SiO_{4/2})_s$ (3)

wherein $R^2$ represents the same meaning as before, and $0 \le p \le 0.6$, $0 \le q \le 1.0$, $0 \le r \le 1.0$, $0 \le s \le 0.99$ and $p+q+R+s=1.0$ wherein one or more types of luminous substances are contained.

2. The silicone resin composition according to claim 1, wherein (A-2) a polyorganosiloxane represented by the following average composition formula (4) having two or more alkenyl groups in one molecule is contained, $(R^1{}_3SiO_{1/2})_w(R^1{}_2SiO_{2/2})_x(R^1SiO_{3/2})_y(SiO_{4/2})_z$ (4)

wherein $R^1$ represents the same meaning as before, and $0 \le w \le 0.6$, $0 \le x \le 1.0$, $0 \le y \le 1.0$, $0 \le z \le 0.99$ and $w+x+y+z=1.0$.

3. The silicone resin composition according to claim 1, wherein the weight average molecular weight of the (A-1) component and/or the (B-1) component is from $3 \times 10^3$ to $1 \times 10^7$.

4. The silicone resin composition according to claim 2, wherein the weight average molecular weight of the (A-1) component and/or the (B-1) component is from $3 \times 10^3$ to $1 \times 10^7$.

5. The silicone resin composition according to claim 2, wherein
the silicone resin composition comprises:
10 to 100 parts by mass of the (A-1) component;
0 to 90 parts by mass of the (A-2) component, wherein a total of the (A-1) component and the (A-2) component is 100 parts by mass;
0 to 100 parts by mass of the (B-1) component;
0 to 100 parts by mass of the (B-2) component, wherein a total of the (B-1) component and the (B-2) component is 100 parts by mass; and
(C) hydrosilylation catalyst.

6. The silicone resin composition according to claim 3, wherein
the silicone resin composition comprises:
10 to 100 parts by mass of the (A-1) component;
0 to 90 parts by mass of the (A-2) component, wherein a total of the (A-1) component and the (A-2) component is 100 parts by mass;
0 to 100 parts by mass of the (B-1) component;

0 to 100 parts by mass of the (B-2) component, wherein a total of the (B-1) component and the (B-2) component is 100 parts by mass; and (C) hydrosilylation catalyst.

7. The silicone resin composition according to claim 4, wherein the silicone resin composition comprises:

10 to 100 parts by mass of the (A-1) component;

0 to 90 parts by mass of the (A-2) component, wherein a total of the (A-1) component and the (A-2) component is 100 parts by mass;

0 to 100 parts by mass of the (B-1) component;

0 to 100 parts by mass of the (B-2) component, wherein a total of the (B-1) component and the (B-2) component is 100 parts by mass; and (C) hydrosilylation catalyst.

8. A luminous substance-containing wavelength-converting film, comprising the silicone resin composition according to claim 1, wherein 10 to 2,000 parts by mass of the luminous substance relative to 100 parts by mass of components other than the luminous substance of the silicone resin composition is contained.

9. The luminous substance-containing wavelength-converting film according to claim 8, wherein the luminous substance-containing wavelength-converting film is plastic solid or semi-solid at normal temperature in an uncured state.

10. The luminous substance-containing wavelength-converting film according to claim 8, wherein the average particle diameter of the luminous substance is 0.05 to 60% of a thickness of the luminous substance-containing wavelength-converting film.

11. The luminous substance-containing wavelength-converting film according to claim 8, wherein the maximum particle diameter of the luminous substance is 0.1 to 90% of a thickness of the luminous substance-containing wavelength-converting film.

12. A cured product, comprising heat-hardening the silicone resin composition according to claim 1.

13. A cured product, comprising heat-hardening the luminous substance-containing wavelength-converting film according to claim 8.

* * * * *